(12) United States Patent
Cheng

(10) Patent No.: US 8,772,053 B2
(45) Date of Patent: Jul. 8, 2014

(54) METHOD AND DEVICE FOR REPAIRING OPEN LINE DEFECT IN LIQUID CRYSTAL DISPLAY ARRAY SUBSTRATE

(71) Applicant: Shenzhen China Star Optoelectronics Technology Co., Ltd., Guangdong (CN)

(72) Inventor: Wenda Cheng, Shenzhen (CN)

(73) Assignee: Shenzhen China Star Optoelectronics Technology co., Ltd., Shenzhen, Guangdong (CN)

( * ) Notice: Subject to any disclaimer, the term of this patent is extended or adjusted under 35 U.S.C. 154(b) by 18 days.

(21) Appl. No.: 13/701,542

(22) PCT Filed: Nov. 15, 2012

(86) PCT No.: PCT/CN2012/084707
§ 371 (c)(1),
(2), (4) Date: Dec. 3, 2012

(65) Prior Publication Data
US 2014/0134755 A1 May 15, 2014

(51) Int. Cl.
*H01L 21/00* (2006.01)
*C23C 16/52* (2006.01)
*C23C 14/54* (2006.01)

(52) U.S. Cl.
USPC ............................... 438/4; 427/8; 427/9

(58) Field of Classification Search
USPC ............................................. 438/4; 427/8, 9
See application file for complete search history.

(56) References Cited

U.S. PATENT DOCUMENTS

| | | | | |
|---|---|---|---|---|
| 4,259,367 A | * | 3/1981 | Dougherty, Jr. | 438/4 |
| 5,043,297 A | * | 8/1991 | Suzuki et al. | 438/598 |
| 2001/0035920 A1 | * | 11/2001 | Choi | 349/54 |
| 2007/0046849 A1 | * | 3/2007 | Lai et al. | 349/54 |

* cited by examiner

*Primary Examiner* — Karen Kusumakar
(74) *Attorney, Agent, or Firm* — Andrew C. Cheng

(57) ABSTRACT

The present invention provides a method for repairing open line defect on LCD array substrate, which includes: when discovering open line defect on a pattern on LCD array substrate, identifying a repair line path of the open line on the pattern and scanning the repair line path; based on the result of scanning the repair line path, dividing the repair line path into at least two path segments and disposing corresponding coating speed for each path segment; and for each path segment, performing coating at the corresponding speed to form connected coating on the repair line path. The present invention also provides a device for repairing open line defect on LCD array substrate. As such, the present embodiment can increase success rate for repairing open lines.

13 Claims, 3 Drawing Sheets

//\*\*// # METHOD AND DEVICE FOR REPAIRING OPEN LINE DEFECT IN LIQUID CRYSTAL DISPLAY ARRAY SUBSTRATE

The present application claims priority of "METHOD AND DEVICE FOR REPAIRING OPEN LINE DEFECT IN LIQUID CRYSTAL DISPLAY ARRAY SUBSTRATE", application number 201210448371.7 submitted to State Intellectual Property Office, People Republic of China dated Nov. 12, 2012.

BACKGROUND OF THE INVENTION

1. Field of the Invention

The present invention relates to the field of thin film transistor liquid crystal display (TFT-LCD) manufacturing techniques, and in particular to a method and device for repairing broken line in LCD array substrate.

2. The Related Arts

In known technique, the line open defect often occurs during TFT-LCD array substrate process. The open line requires repair to reconnect the line.

FIG. 1 is a schematic view showing an open line in the circuit pattern on a known array substrate. FIG. 1 shows only a partial array substrate, wherein a coating process is performed on substrate 1 to form a first pattern 2 and a second pattern 3. The second pattern has open line defect at 40 and 41, which breaks the second pattern 3 into three parts (30, 31, 32).

FIG. 2 is a schematic view showing the structure of a known repair line. As shown in FIG. 2, a repair line path 4 is formed by re-coating, with one end connected to area 30 of the pattern 3 and the other end connected to area 32 of the pattern 3 so as to reconnect the pattern 3.

FIG. 3 is a schematic view showing the structure of a repaired line along the A-A cross-section of FIG. 2. As shown in A-A cross-section of FIG. 2, repair line device 5 (only partially shown) performs coating along the repair line path in FIG. 2 to move from left to right at an even speed. At the part crossing the pattern 2, because a larger height difference exists between the pattern 2 and the substrate 1, the situation of cracking or discontinuity often occurs on the repair line path 4 to render the repair line failure, which leads to poor yield rate of the substrate.

SUMMARY OF THE INVENTION

The technical issue to be addressed by the present invention is to provide a method and device for repairing open line defect of LCD array substrate, able to improve the success rate of repairing open line defect of LCD array substrate.

The present invention provides a method for repairing open line defect in LCD array substrate, which comprises: when discovering open line defect on a pattern on LCD array substrate, identifying a repair line path of the open line on the pattern and scanning the repair line path; based on the result of scanning the repair line path, dividing the repair line path into at least two path segments and disposing corresponding coating speed for each path segment; and for each path segment, performing coating at the corresponding speed to form connected coating on the repair line path.

According to a preferred embodiment of the present invention, the step of scanning the repair line path comprises: using white light interferometry or laser scanning to scan the repair line path and obtaining the height data of each point on the repair line path.

According to a preferred embodiment of the present invention, the step of based on the result of scanning the repair line path, dividing the repair line path into at least two path segments and disposing corresponding coating speed for each path segment comprises specifically: dividing the repair line path into at least two path segments; based on the changes in height data of each point on each path segment, disposing corresponding coating speed for the path segment, wherein the larger the changes in height data on the path segment, the slower the coating speed being disposed for the path segment.

According to a preferred embodiment of the present invention, the step of based on the result of scanning the repair line path, dividing the repair line path into at least two path segments and disposing corresponding coating speed for each path segment comprises specifically: based on the result of scanning the repair line path, identifying the segment of the repair line path passing the edge of the coated line of the pattern on the array substrate; disposing the segment of the repair line path passing the edge of the coated line of the pattern and the segment of the repair line path not passing the edge of the coated line of the pattern as different path segments; and disposing a slower coating speed for segment of the repair line path passing the edge of the coated line of the pattern and a faster coating speed for segment of the repair line path not passing the edge of the coated line of the pattern.

According to a preferred embodiment of the present invention, the coating formed on the repair line path reconnects the open line on the pattern and is insulated from other passed patterns without open line.

The present invention provides a method for repairing open line defect in LCD array substrate, which comprises: when discovering open line defect on a pattern on LCD array substrate, identifying a repair line path of the open line on the pattern; dividing the repair line path into at least two path segments and disposing corresponding coating speed for each path segment; and for each path segment, performing coating at the corresponding speed to form connected coating on the repair line path.

According to a preferred embodiment of the present invention, the step of dividing the repair line path into at least two path segments and disposing corresponding coating speed for each path segment comprises specifically: identifying the segment of the repair line path passing the edge of the coated line of the pattern on the array substrate; disposing the segment of the repair line path passing the edge of the coated line of the pattern and the segment of the repair line path not passing the edge of the coated line of the pattern as different path segments; and disposing a slower coating speed for segment of the repair line path passing the edge of the coated line of the pattern and a faster coating speed for segment of the repair line path not passing the edge of the coated line of the pattern.

According to a preferred embodiment of the present invention, the coating formed on the repair line path reconnects the open line on the pattern and is insulated from other passed patterns without open line.

The present invention provides a device for repairing open line defect in LCD array substrate, which comprises: a detection module, configured to detect whether open line defect occurring on a pattern on an LCD array substrate; a scanning module, configured to identify and scan a repair line path for the open line on the pattern when the detection module detecting open line defect occurring on the pattern on the LCD array substrate; a disposing module, configured to, based on the result of scanning, divide the repair line path into at least two path segments and dispose corresponding coating speed for each path segment; and a coating device, configured to perform coating at the corresponding speed to form connected coating on the repair line path for each path segment disposed by the disposing module.

According to a preferred embodiment of the present invention, the scanning module uses white light interferometry or laser scanning to scan the repair line path and obtaining the height data of each point on the repair line path.

According to a preferred embodiment of the present invention, the disposing module, based on the changes in height data of each point on each path segment, disposes corresponding coating speed for the path segment, wherein the larger the changes in height data on the path segment, the slower the coating speed being disposed for the path segment.

According to a preferred embodiment of the present invention, the disposing module, based on the result of the scanning module, disposes the segment of the repair line path passing the edge of the coated line of the pattern and the segment of the repair line path not passing the edge of the coated line of the pattern as different path segments; and disposes a slower coating speed for segment of the repair line path passing the edge of the coated line of the pattern and a faster coating speed for segment of the repair line path not passing the edge of the coated line of the pattern.

The efficacy of the present invention is that to be distinguished from the state of the art. According to the embodiments of the present invention, by dividing the repair line path into a plurality of path segments and disposing different coating speed for each path segment, the present invention can perform coating on different segment at different coating speed, for example, a slower coating speed for the path segment passing the line edge of the pattern to increase the coating thickness of the path segment so as to form connected coating on the repair line path to increase success rate of the repair line.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
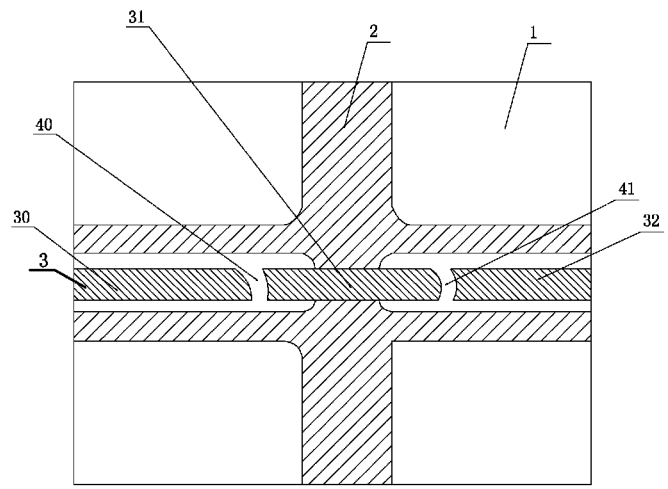
FIG. 1 is a schematic view showing an open line in the circuit pattern on a known array substrate.
Figure 2:
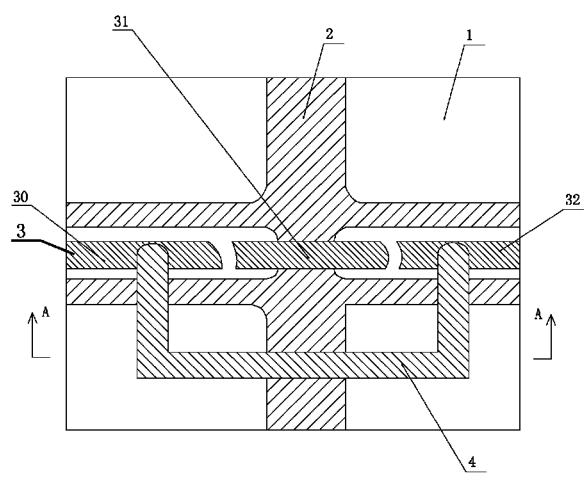
FIG. 2 is a schematic view showing the structure of a known repair line in FIG. 1.
Figure 3:
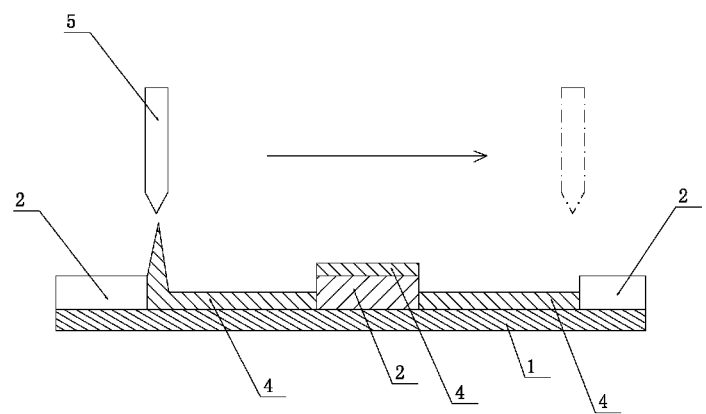
FIG. 3 is a schematic view showing the structure of a repaired line along the A-A cross-section of FIG. 2.

The following refers to the drawings to describe the preferred embodiments of the present invention.

The present invention provides a method for repairing open line defect in LCD array substrate, which comprises: when discovering open line defect on a pattern on LCD array substrate, identify a repair line path of the open line on the pattern and scanning the repair line path; specifically, using white light interferometry or laser scanning to scan the repair line path to obtain the height data of each point on the repair line path; based on the result of scanning the repair line path, dividing the repair line path into at least two path segments and disposing corresponding coating speed for each path segment; and for each path segment, performing coating at the corresponding speed to form connected coating on the repair line path.

In a preferred embodiment of the present invention, the step of based on the result of scanning the repair line path, dividing the repair line path into at least two path segments and disposing corresponding coating speed for each path segment comprises specifically: dividing the repair line path into at least two path segments; based on the changes in height data of each point on each path segment, disposing corresponding coating speed for the path segment, wherein the larger the changes in height data on the path segment, the slower the coating speed being disposed for the path segment.

In another preferred embodiment of the present invention, the step of based on the result of scanning the repair line path, dividing the repair line path into at least two path segments and disposing corresponding coating speed for each path segment comprises specifically: based on the result of scanning the repair line path, identifying the segment of the repair line path passing the edge of the coated line of the pattern on the array substrate; in general, the height changing greatly at the edge of the pattern line; disposing the segment of the repair line path passing the edge of the coated line of the pattern and the segment of the repair line path not passing the edge of the coated line of the pattern as different path segments; and disposing a slower coating speed for segment of the repair line path passing the edge of the coated line of the pattern and a faster coating speed for segment of the repair line path not passing the edge of the coated line of the pattern.

After the above steps of repairing line, the coating formed on the repair line path reconnects the open line on the pattern and is insulated from other passed patterns without open line.

The present invention also provides a device for repairing open line defect in LCD array substrate, which comprises: a detection module, configured to detect whether open line defect occurring on a pattern on an LCD array substrate; a scanning module, configured to identify and scan a repair line path for the open line on the pattern when the detection module detecting open line defect occurring on the pattern on the LCD array substrate; a disposing module, configured to, based on the result of scanning, divide the repair line path into at least two path segments and dispose corresponding coating speed for each path segment; and a coating device, configured to perform coating at the corresponding speed to form connected coating on the repair line path for each path segment disposed by the disposing module.

In a preferred embodiment of the present invention, the scanning module uses white light interferometry or laser scanning to scan the repair line path and obtaining the height data of each point on the repair line path.

In another preferred embodiment of the present invention, the disposing module, based on the changes in height data of each point on each path segment, disposes corresponding coating speed for the path segment, wherein the larger the changes in height data on the path segment, the slower the coating speed being disposed for the path segment.

In another preferred embodiment of the present invention, the disposing module, based on the result of the scanning module, disposes the segment of the repair line path passing the edge of the coated line of the pattern and the segment of the repair line path not passing the edge of the coated line of the pattern as different path segments; and disposes a slower coating speed for segment of the repair line path passing the edge of the coated line of the pattern and a faster coating speed for segment of the repair line path not passing the edge of the coated line of the pattern.

Figure 4:
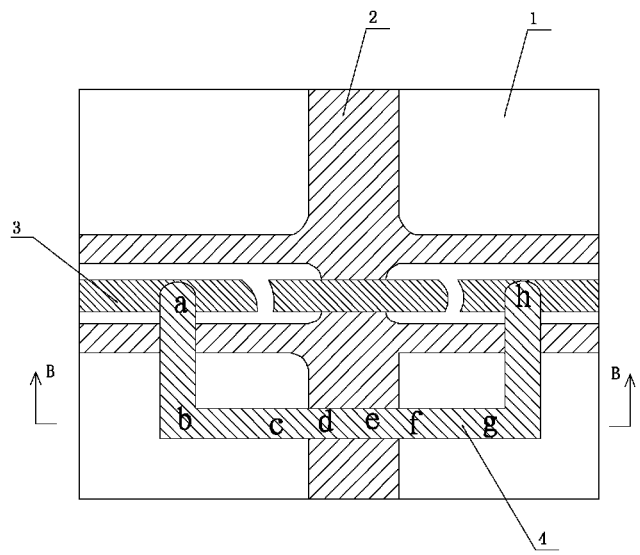
FIG. 4 is schematic view showing the structure of an embodiment of repairing open line on LCD array substrate according to the present invention.
Figure 5:
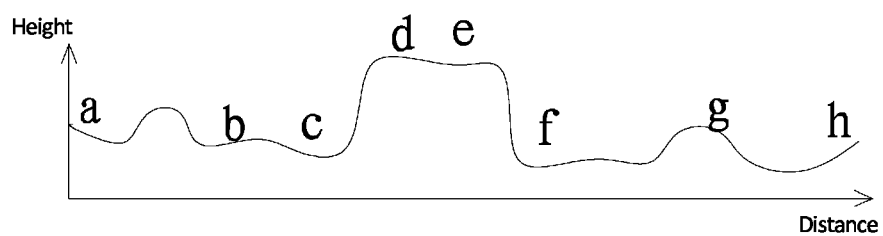
FIG. 5 is a plot of height obtained by scanning the repair line path of FIG. 4 according to the present invention.
Figure 6:
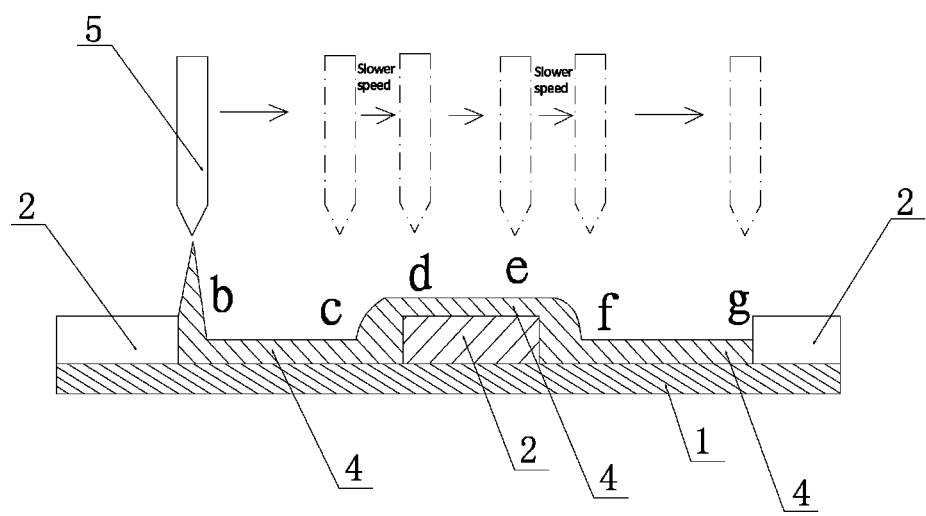
FIG. 6 is a schematic view showing the structure of the repaired line along the cross-section of B-B in FIG. 4.

The following refers to FIGS. 4-6 to describe the realization of the method and device for repairing open line defects in LCD array substrate in details.

In a preferred embodiment, referring to FIG. 4, a first pattern 2 and a second pattern 3 are formed on a substrate 1, wherein the second pattern 3 and the first pattern 2 partially overlap and are insulated from each other. However, an open defect occurs during coating on the second pattern 3. When an open line defect is detected on the pattern 3 of substrate 1, a repair line path 4 is identified.

At this point, a scanning device can be used to scan the repair line path. For example, white light interferometry or laser scanning can be used to scan the repair line path and obtain the height data of each point on the repair line path, which results in a plot of height data of the repair line path as shown in FIG. 5.

Based on the scanning result, the repair line path is divided into a plurality of path segments and each path segment is disposed with a corresponding coating speed. As shown in FIG. 4, the repair line path is divided into seven path segments, including: a-b segment, b-c segment, c-d segment, d-e segment, e-f segment, f-g segment and g-h segment respectively. The changes in height in a-b segment, b-c segment, d-e segment, f-g segment and g-h segment are not much so that the coating speeds for these path segments can be roughly the same. On the other hand, the changes in height in c-d segment and e-f segment are large so that the coating speeds for these two path segments should be slower.

Alternatively, based on the result of scanning repair line path, the segments passing the edges of coated pattern (as the pattern 2) line on the array substrate can be identified directly, for example, c-d segment and e-f segment are directly identified as the segments passing the edge of pattern 2 line.

Then, the segments (c-d segment and e-f segment) of the repair line path passing the edge of the coated line of the pattern and the segments (a-b segment, b-c segment, d-e segment, f-g segment and g-h segment) of the repair line path not passing the edge of the coated line of the pattern are disposed as different path segments.

A slower coating speed is disposed for path segments passing the edge of the coated line of the pattern and a faster coating speed is disposed for path segments not passing the edge of the coated line of the pattern. In other words, the c-d segment and e-f segment are disposed with a slower coating speed.

FIG. 6 is a schematic view showing the structure of after repairing with the method for repairing open line defect on LCD array substrate according to the present invention. As shown in FIG. 6, for each path segment, the coating is performed at corresponding coating speed to form connected coating on the repair line path 4. In the instant embodiment, the coating speed on the c-d segment and the e-f segment is slower to increase the coating thickness so as to prevent the open coating situation in know technique from occurring and increase the success rate of repair. After the above repair process, the coating formed on the repair line path 4 reconnects the open line on the second pattern 3 and is insulated from other passed patterns, such as, the first pattern 2, without open line.

As such, based on the embodiments of the present invention, by dividing the repair line path into a plurality of path segments and disposing different coating speed for each path segment, the present invention can perform coating on different segment at different coating speed, for example, a slower coating speed for the path segment passing the line edge of the pattern to increase the coating thickness of the path segment so as to form connected coating on the repair line path to increase success rate of the repair line.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A method for repairing open line defect in liquid crystal display (LCD) array substrate, which comprises:
    when discovering open line defect on a pattern on LCD array substrate, identifying a repair line path of the open line on the pattern and scanning the repair line path;
    based on the result of scanning the repair line path, dividing the repair line path into at least two path segments and disposing corresponding coating speed for each path segment; and
    for each path segment, performing coating at the corresponding speed to form connected coating on the repair line path.

2. The method for repairing open line defect in LCD array substrate as claimed in claim 1, characterized in that the step of scanning the repair line path comprises:
    using white light interferometry or laser scanning to scan the repair line path and obtaining the height data of each point on the repair line path.

3. The method for repairing open line defect in LCD array substrate as claimed in claim 2, characterized in that the step of based on the result of scanning the repair line path, dividing the repair line path into at least two path segments and disposing corresponding coating speed for each path segment comprises specifically:
    dividing the repair line path into at least two path segments;
    based on the changes in height data of each point on each path segment, disposing corresponding coating speed for the path segment, wherein the larger the changes in height data on the path segment, the slower the coating speed being disposed for the path segment.

4. The method for repairing open line defect in LCD array substrate as claimed in claim 2, characterized in that the step of dividing the repair line path into at least two path segments and disposing corresponding coating speed for each path segment comprises specifically:
    identifying the segment of the repair line path passing the edge of the coated line of the pattern on the array substrate;
    disposing the segment of the repair line path passing the edge of the coated line of the pattern and the segment of the repair line path not passing the edge of the coated line of the pattern as different path segments; and
    disposing a slower coating speed for segment of the repair line path passing the edge of the coated line of the pattern and a faster coating speed for segment of the repair line path not passing the edge of the coated line of the pattern.

5. The method for repairing open line defect in LCD array substrate as claimed in claim 3, characterized in that the coating formed on the repair line path reconnects the open line on the pattern and is insulated from other passed patterns without open line.

6. The method for repairing open line defect in LCD array substrate as claimed in claim 4, characterized in that the coating formed on the repair line path reconnects the open line on the pattern and is insulated from other passed patterns without open line.

7. A method for repairing open line defect in liquid crystal display (LCD) array substrate, which comprises:
- when discovering open line defect on a pattern on LCD array substrate, identifying a repair line path of the open line on the pattern;
- dividing the repair line path into at least two path segments and disposing corresponding coating speed for each path segment; and
- for each path segment, performing coating at the corresponding speed to form connected coating on the repair line path.

8. The method for repairing open line defect in LCD array substrate as claimed in claim 7, characterized in that the step of dividing the repair line path into at least two path segments and disposing corresponding coating speed for each path segment comprises specifically:
- identifying the segment of the repair line path passing the edge of the coated line of the pattern on the array substrate;
- disposing the segment of the repair line path passing the edge of the coated line of the pattern and the segment of the repair line path not passing the edge of the coated line of the pattern as different path segments; and
- disposing a slower coating speed for segment of the repair line path passing the edge of the coated line of the pattern and a faster coating speed for segment of the repair line path not passing the edge of the coated line of the pattern.

9. The method for repairing open line defect in LCD array substrate as claimed in claim 8, characterized in that the coating formed on the repair line path reconnects the open line on the pattern and is insulated from other passed patterns without open line.

10. A device for repairing open line defect in liquid crystal display (LCD) array substrate, which comprises:
- a detection module, configured to detect whether open line defect occurring on a pattern on an LCD array substrate;
- a scanning module, configured to identify and scan a repair line path for the open line on the pattern when the detection module detecting open line defect occurring on the pattern on the LCD array substrate;
- a disposing module, configured to, based on the result of scanning, divide the repair line path into at least two path segments and dispose corresponding coating speed for each path segment; and
- a coating device, configured to perform coating at the corresponding speed to form connected coating on the repair line path for each path segment disposed by the disposing module.

11. The device for repairing open line defect in LCD array substrate as claimed in claim 10, characterized in that the scanning module uses white light interferometry or laser scanning to scan the repair line path and obtaining the height data of each point on the repair line path.

12. The device for repairing open line defect in LCD array substrate as claimed in claim 11, characterized in that the disposing module, based on the changes in height data of each point on each path segment, disposes corresponding coating speed for the path segment, wherein the larger the changes in height data on the path segment, the slower the coating speed being disposed for the path segment.

13. The device for repairing open line defect in LCD array substrate as claimed in claim 11, characterized in that the disposing module, based on the result of the scanning module, disposes the segment of the repair line path passing the edge of the coated line of the pattern and the segment of the repair line path not passing the edge of the coated line of the pattern as different path segments; and disposes a slower coating speed for segment of the repair line path passing the edge of the coated line of the pattern and a faster coating speed for segment of the repair line path not passing the edge of the coated line of the pattern.

\* \* \* \* \*